United States Patent [19]

Castaneda et al.

[11] Patent Number: 5,596,487
[45] Date of Patent: Jan. 21, 1997

[54] APPARATUS FOR RF SHIELDING RADIO CIRCUITRY

[75] Inventors: Julio C. Castaneda, Coral Springs; David H. Minasi, Plantation; Kok H. Chong, Sunrise; Roger D. Gamble, Coral Springs, all of Fla.

[73] Assignee: Motorola, Inc., Schaumburg, Ill.

[21] Appl. No.: 509,147

[22] Filed: Jul. 31, 1995

[51] Int. Cl.⁶ ...................................................... H04B 1/03
[52] U.S. Cl. ........................... 361/814; 361/753; 361/816; 361/818; 174/35 R; 174/35 TS; 174/35 GC
[58] Field of Search ..................... 379/433–434, 379/428–429; 174/35 R, 35 GC, 35 TS; 455/89–90, 347, 300; 307/89–91; 361/753, 816, 818, 799, 800, 212, 220

[56] References Cited

U.S. PATENT DOCUMENTS

| | | | |
|---|---|---|---|
| 4,663,240 | 5/1987 | Hajdu et al. . | |
| 4,680,676 | 7/1987 | Petratos et al. | 361/424 |
| 4,717,989 | 1/1988 | De Barros et al. | 361/424 |
| 4,717,990 | 1/1988 | Tugeu | 361/424 |
| 5,031,027 | 7/1991 | Dorinski et al. | 357/74 |
| 5,053,924 | 10/1991 | Kurgan | 361/424 |
| 5,517,676 | 5/1996 | Sevkine et al. . | |

*Primary Examiner*—Leo P. Picard
*Assistant Examiner*—Phuong T. Vu
*Attorney, Agent, or Firm*—Barbara R. Doutre

[57] ABSTRACT

First and second shielding portions (110, 112) formed of electroless plated plastic enclose a radio frequency (RF) board (108). Bosses (148) extend from inner surfaces (130, 142) of the first and second shielding portions (110, 112) to make contact with compressible ground clip members (126) located on the RF board (108).

4 Claims, 2 Drawing Sheets

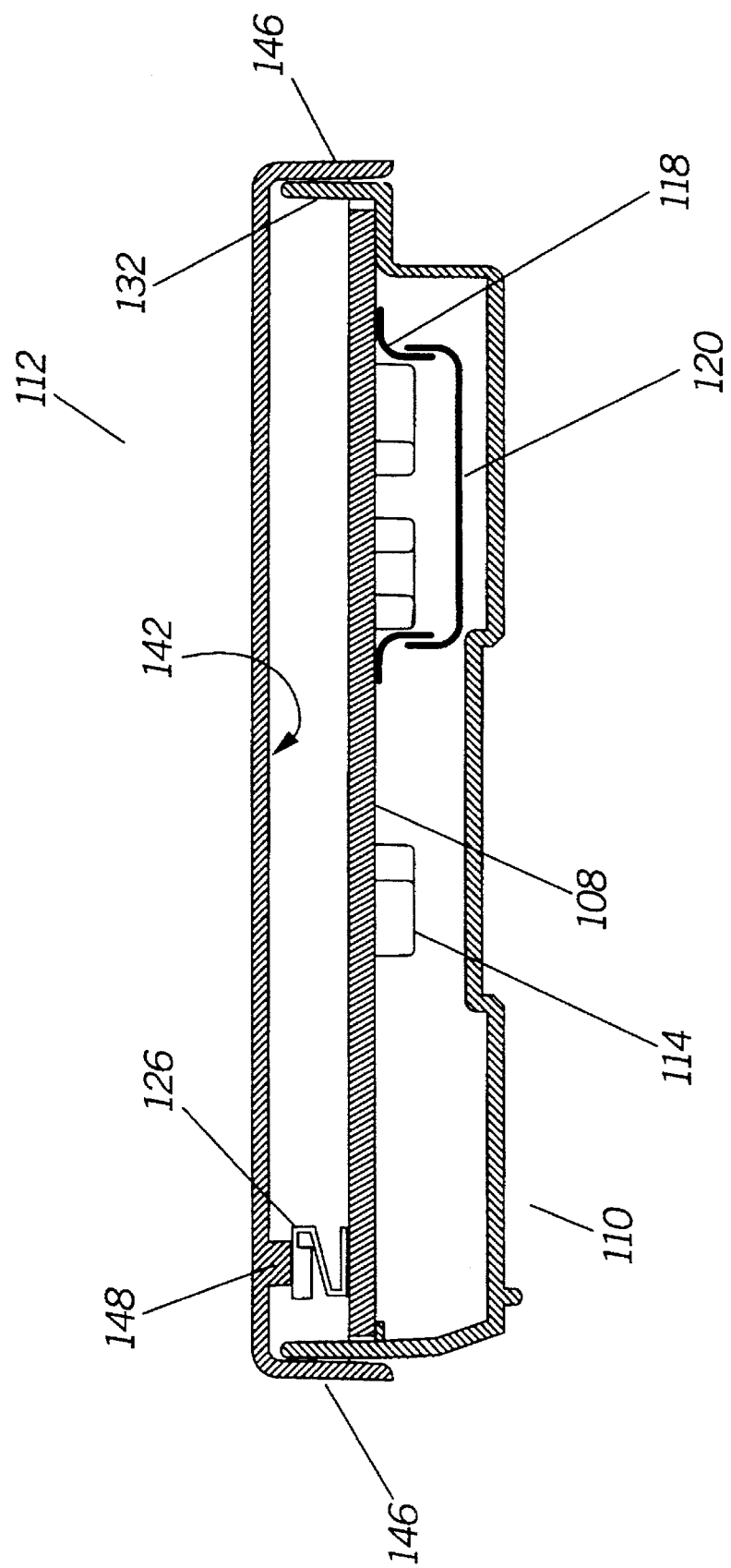

APPARATUS FOR RF SHIELDING RADIO CIRCUITRY

TECHNICAL FIELD

This invention relates in general to radio products and more specifically to the EMI/RFI shielding of radio products.

BACKGROUND

In many electrical circuit applications, such as those used in radio transmitters, certain components must often be shielded from electromagnetic interference (EMI) and radio frequency interference (RFI) so that the performance of such circuits is not degraded. Where appropriate, EMI/RFI protection has included the provision of metal boxes or cans including a top wall and side walls positioned around critical electrical components to act as a shield and prevent EMI/RFI from passing through such a barrier. In general, such shields have been located on the radio circuit board substrates after the placement of components, typically using reflow soldering techniques. Typically, a radio's transceiver portion (transmitter and receiver circuitry) is given a separate overall shield from its controller portion to control both radiated and conducted RF. Metal shields, either soldered or secured to the perimeter of the transceiver via screws, are costly and heavy. Metallic painted shields, while lighter, tend to be highly resistive and are less effective as barriers against EMI/RFI. There is a significant drive from designers to make a portable radio product that is as lightweight and cost effective as possible while still maintaining the electrical integrity of the product. While certain individual circuits within the transceiver, such as the power amplifier, may still require individual shielding, it would be a benefit to have a radio product that uses an overall shield that is lightweight, inexpensive to manufacture, and easily assembled.

BRIEF DESCRIPTION OF THE DRAWINGS

FIG. 2 is a cross sectional view of a shield assembly in accordance with the present invention.

DETAILED DESCRIPTION OF THE PREFERRED EMBODIMENT

Figure 1:
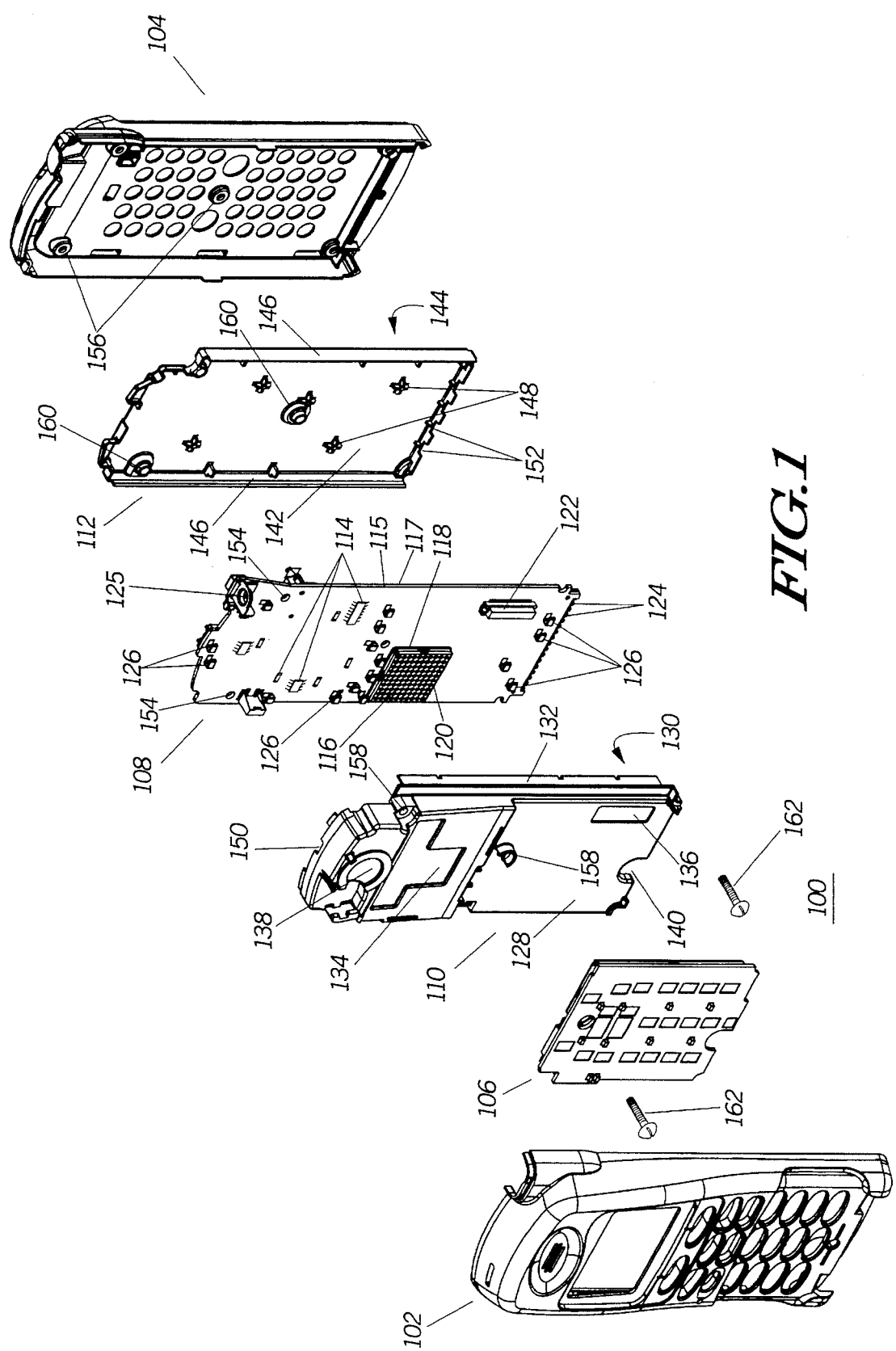
FIG. 1 is an exploded perspective view of a radio in accordance with the present invention.

Referring now to FIG. 1, there is shown an exploded perspective view of a portable radio 100 in accordance with the present invention. Radio 100 includes front and back housing portions 102, 104 respectively, preferably formed of poly-carbonate material. Radio 100 further includes a controller board 106 and an RF board 108. In accordance with the present invention, front and back shields 110, 112 (also referred to as first and second shielding portions) provide an overall shield to control EMI/RFI for the RF board 108. In accordance with the present invention, front and back shields 110, 112 comprise electroless plated plastic shields which are lighter and less resistive than metal-based painted plastic shields.

RF board 108, preferably a multi-layer printed circuit board (pcb), includes a plurality of electronic circuit components 114 on first and second surfaces 115, 117. Electronic circuit components 114 provide receiver and transmitter circuitry for the radio 100. Sheet metal shields 116 are preferably used within RF board 108 to shield certain individual circuits known to be particularly sensitive to EMI from external and internal radiation sources. The sheet metal shields 116 are preferably formed of aluminum-based sheet metal consisting of a fence portion 118 soldered to the pcb and a cover portion 120 that snaps onto the fence portion. The cover portion 120 is preferably perforated to take advantage of field cancellation while reducing weight. RF board 108 further includes connector 122 for mating with the controller board 106. Electrical contacts 124, preferably located at the bottom edge of RF board 108, provide contacts for battery and external accessory options. Antenna port 125 provides an interconnect for an antenna (not shown). In accordance with the present invention, at least one but preferably a plurality of compressible ground clip members 126 are soldered onto at least one surface of the RF board 108. These compressible ground clip members 126 are electrically coupled to an electrical ground of the RF board 108 and are preferably machine placed during the electronic circuit component placement of the pcb. In the preferred embodiment of the invention, compressible ground clip members 126 are located on both the first and second surfaces 115, 117 of RF board 108.

In accordance with the present invention, front shield 110 includes inner and outer surfaces 128 and 130 with side walls, or flanges, 132 extending therefrom. In the preferred embodiment, a first recessed portion 134 provides a cavity within which a liquid crystal display (not shown) can be seated. Various other openings, cavities, and recessed areas 136, 138, 140 provide room for interconnects, speaker mounting, and microphone boot. Protruding from the inner surface 130 of the front shield 110 are bosses (similar to bosses 148 shown on back shield 112) positioned such that they align with the compressible ground clips 126 on the first surface 115 of the pcb. When RF board 108 is placed within side walls 132 an electrical connection between ground and the front shield 110 is made through the bosses and the compressible ground clip members 126. When assembled, front shield 110 encloses the front surface 115 of RF board 108 within side walls 132 such that only interconnects and peripheral interface items, such as electrical contacts 124 and antenna interconnect 125, remain exposed.

In accordance with the present invention, back shield 112 includes inner and outer surfaces 142, 144 and side walls 146 extending therefrom. Protruding from the inner surface 142 of the back shield 112 are bosses 148 positioned such that they align with compressible ground clips 126 located on the second surface 117 of the pcb. When the back shield 112 is disposed about the back surface 117 of RF board 108, the bosses 148 and compressible ground clips 126 align so that the back shield makes contact to the electrical ground of the pcb. When back shield 112 is disposed about RF board 108, the back shield side walls 146 overlap and make contact with the front shield side walls 132 thus capacitively coupling the two shields together. When the front and back shields 110, 112 are assembled about RF board 108, only the interface contacts 124 and interconnects, such as connector 124 and antenna port 125, remain exposed.

The bottom and top edges of the front and back shields 110, 112 preferably include notched openings, such as notched openings 152 located on the bottom edge of back shield 112, and notched opening 150, located at the top edge of front shield 110. These notched openings 150, 152 also align and mate with corresponding compressible ground clip members 126 located on the pcb. The notched openings 150, 152 in conjunction with compressible ground clip members 126 help prevent over-stressing of the plated plastic shields as well as provide additional ground contact between the edges of the shields and the pcb.

As previously mentioned, in accordance with the invention, the front and back shields 110, 112 comprise electroless plated plastic shields. Front and back shields 110, 112 are preferably formed of thin wall molded CYCOLOY® which is a blend of poly-carbonate and acrylonitrile-butadiene-styrene (PC/ABS) manufactured by General Electric Inc. The shields are plated using an electroless plating process of approximately $(103 \text{ to } 257) \times 10^{-6}$ centimeters (cm) of copper under approximately $(25 \text{ to } 77) \times 10^{-6}$ cm of nickel.

In the preferred embodiment of the invention, the compressible ground clip members 126 are located on both sides of the RF board 108 and are positioned so as to mate to the bosses 148 or notched openings 150, 152 of the front and back shields 110, 112. Capacitive coupling is formed through the overlapping of side walls 132, 146 which enclose the electrical components 114 of RF board 108. Front shield 110 includes at least one and preferably a plurality of guide holes 158 which align with holes 154 of the pcb, and guide holes 160 of the back shield 112. Threaded members (not shown) can be inserted into the front shield guide holes 158 to receive screws 162. The front and back shields 110, 112 can then be compressed, or sandwiched, together about the pcb and coupled to the back housing 104 through threaded members 156 located in back housing 104. Front housing 102 then snaps on to the back housing 104 for a completed radio body. By using electroless plated plastic shields and the compressible ground clips in the manner described by the present invention the overall weight and cost of the radio can be significantly reduced as compared to the traditional metal shields or painted plastic shields.

Referring now to FIG. 2 of the accompanying drawings there is shown a cross sectional view of a shield assembly 200 in accordance with the present invention. RF board 108 includes electrical components 114, some of which are enclosed in a separate metal shield comprising fence 118 and cover 120. Front shield 110 receives RF board 108 within side walls 132. RF board 108 includes at least one compressible ground clip member 126 electrically coupled to the ground of the RF board 108. Back shield 112 having side walls 146 and boss 148 extending from its inner surface 142 is disposed about the front shield 110 such that back shield side walls 146 overlap with front shield side walls 132. Ground clip member 126 aligns and makes contact with corresponding boss 148 so that the back shield 112 makes an electrical connection to the ground of the RF board 108. The overlapping side walls 132, 146 of the front and back shields 110, 112 contact each other and thus form capacitive coupling therebetween.

By disposing electroless plated plastic shields about the RF board 108 and providing compressible ground clip members 126 in the manner described by the invention the overall cost and weight of shielding a portable radio is reduced as compared to metal shields. The electroless plated plastic shields offer lower resistance relative to metal-based paints (0.1 ohms per square versus 2 ohms per square) providing more effective ground coupling. Since the plated plastic is not a primary load bearing structure, the brittleness usually associated with this process does not affect the structural integrity of the portable radio of this invention.

Numerous modifications, changes, variations, substitutions, and equivalents will occur to those skilled in the art without departing from the spirit and scope of the present invention as defined by the appended claims.

What is claimed is:

1. A radio assembly, comprising:

a front housing;

a back housing;

an electronic circuit board having front and back surfaces;

at least one compressible ground clip member electrically coupled to the electronic circuit board;

a first electroless plated plastic shield having inner and outer surfaces and side walls extending from said inner surface, said inner surface including at least one protruding boss;

said first electroless plated plastic shield disposed about said electronic circuit board such that the side walls of the first electroless plated plastic shield enclose a predetermined portion of the front surface of the electronic circuit board, said at least one protruding boss aligning with said at least one compressible ground clip member;

a second electroless plated plastic shield having inner and outer surfaces and side walls extending from said inner surface, said second electroless plated plastic shield disposed about said electronic circuit board such that the sides walls of the second electroless plated plastic shield and the side walls of the first electroless plated plastic shield overlap and capacitively couple;

at least one screw for mechanically coupling the first electroless plated plastic shield, the electronic circuit board, the second electroless plated plastic shield, and the back housing; and wherein the printed circuit board further comprises:

an aluminum-based fence soldered about a predetermined electrical circuit of the electronic circuit board; and a perforated aluminum-based cover snap fitted onto the fence covering the predetermined electrical circuit.

2. A shield assembly for isolating radio frequency (RF) circuitry, the RF circuitry being disposed on a printed circuit board (pcb) having first and second surfaces, said shield assembly comprising:

a plurality of compressible ground clip members coupled to the RF circuitry on the first surface of the pcb;

a first shielding portion constructed of electroless plated plastic having an inner surface and side walls extending therefrom, said first shielding portion disposed about said pcb such that the inner surface covers the RF circuitry of the pcb and the side walls enclose the RF circuitry, said first shielding portion including a plurality of bosses protruding from said inner surface and aligning with said compressible ground clip members forming electrical ground contacts to the first shielding portion;

a second shielding portion constructed of electroless plated plastic having an inner surface and side walls extending therefrom, said second shielding portion disposed about the second surface of the pcb such that the side walls of the second shielding portion overlap with the side walls of the first shielding portion forming capacitive coupling therebetween; and wherein the printed circuit board further comprises:
a predetermined electrical circuit:
an aluminum-based fence soldered about the predetermined electrical circuit on the pcb; and
a perforated aluminum-based cover snap fitted onto the fence covering the predetermined electrical circuit.

3. A shield assembly as described in claim 2, wherein the second surface of the pcb includes a plurality of compressible ground clip members and the inner surface of the second shielding portion includes a plurality of bosses extending therefrom, said plurality of bosses and compressible ground clip members aligning to form electrical ground contacts to the second shielding portion.

4. A shield assembly as described in claim 2, wherein the first and second shield portions and the pcb include at least one guide hole for receiving a screw to compressibly couple the first and second shield portions and the pcb.

* * * * *